(12) United States Patent
Sadayori (10) Patent No.: US 11,616,182 B2
(45) Date of Patent: Mar. 28, 2023

(54) METHOD OF PRODUCING SEMICONDUCTOR SINTERED BODY, ELECTRICAL/ELECTRONIC MEMBER, AND SEMICONDUCTOR SINTERED BODY

(71) Applicant: NITTO DENKO CORPORATION, Ibaraki (JP)

(72) Inventor: Naoki Sadayori, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 16/612,850

(22) PCT Filed: May 17, 2018

(86) PCT No.: PCT/JP2018/019160
§ 371 (c)(1),
(2) Date: Nov. 12, 2019

(87) PCT Pub. No.: WO2018/212296
PCT Pub. Date: Nov. 22, 2018

(65) Prior Publication Data
US 2020/0203590 A1    Jun. 25, 2020

(30) Foreign Application Priority Data

May 19, 2017   (JP) .............................. JP2017-100107
May 19, 2017   (JP) .............................. JP2017-100108
Oct. 13, 2017   (JP) .............................. JP2017-199057

(51) Int. Cl.
*H01L 35/18*      (2006.01)
*H01L 35/22*      (2006.01)
(Continued)

(52) U.S. Cl.
CPC ............ *H01L 35/18* (2013.01); *B22F 3/1003* (2013.01); *B22F 3/105* (2013.01); *B28B 11/243* (2013.01);
(Continued)

(58) Field of Classification Search
CPC ......... H01L 35/22; H01L 35/24; H01L 35/28; H01L 35/34; C01B 33/06; B82Y 30/00;
(Continued)

(56) References Cited

U.S. PATENT DOCUMENTS 7,002,071 B1 *   2/2006   Sadatomi ................ H01L 35/22
                                                                     136/239
9,190,593 B2    11/2015   Hwang et al.
(Continued)

FOREIGN PATENT DOCUMENTS

CN         101226983 A     7/2008
EP           1083610 A1     3/2001
(Continued)

OTHER PUBLICATIONS

Extended European Search Report issued for European Patent Application No. 18802437.6 dated Jan. 27, 2021.
(Continued)

*Primary Examiner* — Bethany L Martin
*Assistant Examiner* — Kourtney R S Carlson
(74) *Attorney, Agent, or Firm* — Hauptman Ham, LLP (57) ABSTRACT

A semiconductor sintered body comprising a polycrystalline body, wherein the polycrystalline body includes silicon or a silicon alloy, wherein the average grain size of the crystal grains forming the polycrystalline body is 1 μm or less, and wherein nanoparticles including one or more of a carbide of silicon, a nitride of silicon, and an oxide of silicon are present at a grain boundary of the grains.

20 Claims, 2 Drawing Sheets (51) Int. Cl.

| | | |
|---|---|---|
| H01L 35/26 | (2006.01) | |
| H01L 35/24 | (2006.01) | |
| H01L 35/28 | (2006.01) | |
| C01B 33/06 | (2006.01) | |
| H01L 35/34 | (2006.01) | |
| B28B 11/24 | (2006.01) | |
| B22F 3/10 | (2006.01) | |
| B22F 3/105 | (2006.01) | |
| B82Y 30/00 | (2011.01) | |

(52) U.S. Cl.
CPC .............. *C01B 33/06* (2013.01); *H01L 35/22* (2013.01); *H01L 35/24* (2013.01); *H01L 35/26* (2013.01); *H01L 35/28* (2013.01); *H01L 35/34* (2013.01); *B82Y 30/00* (2013.01); *C01P 2002/54* (2013.01); *C01P 2002/60* (2013.01); *C01P 2004/04* (2013.01); *C01P 2004/61* (2013.01); *C01P 2006/32* (2013.01); *C01P 2006/40* (2013.01)

(58) Field of Classification Search
CPC .............. C01P 2002/54; C01P 2002/60; C01P 2004/04; C01P 2004/61; C01P 2006/32; C01P 2006/40
See application file for complete search history.

(56) References Cited

U.S. PATENT DOCUMENTS

| | | | |
|---|---|---|---|
| 2003/0032709 A1* | 2/2003 | Toshima ................. | H01L 35/24 524/439 |
| 2006/0102224 A1 | 5/2006 | Chen et al. | |
| 2008/0173344 A1 | 7/2008 | Zhang et al. | |
| 2008/0202575 A1 | 8/2008 | Ren et al. | |
| 2010/0051081 A1 | 3/2010 | Iida et al. | |
| 2012/0118343 A1 | 5/2012 | Iida et al. | |
| 2012/0282435 A1 | 11/2012 | Yang et al. | |
| 2014/0116491 A1* | 5/2014 | Reifenberg ............ | H01L 35/22 136/203 |
| 2014/0360546 A1 | 12/2014 | Reifenberg et al. | |
| 2015/0069284 A1* | 3/2015 | Murai ..................... | H01L 35/26 252/62.3 T |
| 2015/0357543 A1 | 12/2015 | Yabuuchi et al. | |
| 2016/0072033 A1 | 3/2016 | Carberry | |
| 2016/0359096 A1 | 12/2016 | Yang et al. | |
| 2018/0033939 A1 | 2/2018 | Kwon et al. | |
| 2018/0175272 A1 | 6/2018 | Imai et al. | |
| 2018/0212131 A1 | 7/2018 | Kikuchi et al. | |

FOREIGN PATENT DOCUMENTS

| | | |
|---|---|---|
| JP | H07-38156 A | 2/1995 |
| JP | 2000-261044 A | 9/2000 |
| JP | 2000-261045 A | 9/2000 |
| JP | 2001-068744 A | 3/2001 |
| JP | 2003-046145 A | 2/2003 |
| JP | 2006-176859 A | 7/2006 |
| JP | 2008-523579 A | 7/2008 |
| JP | 2011-503878 A | 1/2011 |
| JP | 2011-49538 A | 3/2011 |
| JP | 2011-249742 A | 12/2011 |
| JP | 2012-190984 A | 10/2012 |
| JP | 2012-253229 A | 12/2012 |
| JP | 2013-179322 A | 9/2013 |
| JP | 2015-056491 A | 3/2015 |
| JP | 2016-504756 A | 2/2016 |
| JP | 5941562 B2 | 6/2016 |
| JP | 2016-131232 A | 7/2016 |
| JP | 2016-528716 A | 9/2016 |
| JP | 2016-219666 A | 12/2016 |
| KR | 10-2009-0107491 A | 10/2009 |
| KR | 10-2013-0084120 A | 7/2013 |
| KR | 10-2016-0018657 A | 2/2016 |
| KR | 10-2017-0011159 A | 2/2017 |
| WO | 2008/075789 A1 | 6/2008 |
| WO | 2014/118959 A1 | 8/2014 |
| WO | 2017/014583 A1 | 1/2017 |
| WO | 2017/038324 A1 | 3/2017 |
| WO | 2017/057237 A1 | 4/2017 |

OTHER PUBLICATIONS

Extended European Search Report issued for European Patent Application No. 18803227.0 dated Jan. 27, 2021.
Extended European Search Report issued for European Patent Application No. 18803228.8 dated Jan. 27, 2021.
Sabah K. Bux et al., "Nanostructured Bulk Silicon as an Effective Thermoelectric Material", Advanced Functional Materials, 2009, p. 2445-p. 2452, vol. 19, InterScience, Weinheim, cited in the Specification.
Koya Arai et al., "Fabrication of Mg2Si bulk by spark plasma sintering method with Mg2Si nano-powder", Materials Research Society Symo, 2013, p. 63-p. 68, vol. 1490, DOI:10.1557/opl.2012. 1732, Department of Materials Science and Technology, Japan.
International Search Report for corresponding international application PCT/JP2018/019159 dated Jul. 24, 2018.
International Search Report for corresponding international application PCT/JP2018/019160 dated Jul. 24, 2018.
International Search Report for corresponding international application PCT/JP2018/019161 dated Jul. 24, 2018.
Office Action issued for related U.S. Appl. No. 16/612,466 dated Mar. 31, 2021.
Office Action issued for related U.S. Appl. No. 16/612,466 dated Jul. 8, 2021.
Office Action dated Sep. 2, 2021 for corresponding Taiwanese Patent Application No. 107117015, along with an English translation.
Office Action dated Sep. 2, 2021 for corresponding Taiwanese Patent Application No. 107117013, along with an English translation.
Office Action dated Sep. 2, 2021 for corresponding Taiwanese Patent Application No. 107117012, along with an English translation.
Office Action dated Sep. 30, 2021 for co-pending U.S. Appl. No. 16/612,466.
Schieming et al., "Role of oxygen on microstructure and thermoelectric properties of silicon nanocomposites", Journal of Applied Physics 110, 113515 (2011), cited in NPL Nos. 1 and 2.
Kasiarova et al., "Microstructure and Creep Behavior of a Si3N4-SiC Micronanocomposite", Journal of the American Ceramic Society, vol. 92, No. 2, (2009), pp. 439-444, cited in NPL No. 2.
Zhu et al., "Increased Phonon Scattering by Nanograins and Point Defects in Nanostructured Silicon with a Low Concentration of Germanium", Physical Review Letters, 102, 196803 (2009), cited in NPL No. 2.
Kajikawa et al., "Thermoelectric Figure of Merit of Impurity Doped and Hot-pressed Magnesium Silicide Elements", 17th International Conference on Thermoelectrics (1998), Proceedings ICT98 (Cat. No. 98TH8365), Date of Conference: May 28-28, 1998, pp. 362-369, cited in NPL No. 3.
Office Action dated Mar. 15, 2022 for corresponding Japanese Patent Application No. 2018-095174, along with an English machine translation.
Fiameni et al., "Synthesis and characterization of Bi-doped Mg2Si thermoelectric materials", Journal of Solid State Chemistry 193 (2012), pp. 142-146, cited in NPL No. 1.
Vivekanandhan et al., "Rapid in-situ synthesis of nanocrystalline magnesium silicide thermo-electric compound by spark plasma sintering", Materials Letters 197 (Mar. 23, 2017), pp. 106-110, cited in NPL No. 1.
Office Action dated Jan. 20, 2022, for co-pending U.S. Appl. No. 16/612,466.
Office Action dated Apr. 27, 2022, for related U.S. Appl. No. 16/612,466.
Office Action dated Jun. 30, 2022 for corresponding Korean Patent Application No. 10-2019-7033740, along with an English machine translation.

(56) References Cited

OTHER PUBLICATIONS

Office Action dated Jun. 30, 2022 for corresponding Korean Patent Application No. 10-2019-7033739, along with an English machine translation.
Office Action dated Jun. 30, 2022 for corresponding Korean Patent Application No. 10-2019-7033738, along with an English machine translation.
Japanese Office Action dated Jun. 21, 2022 in connection with the Japanese Patent Application No. 2018-095172.
Japanese Office Action dated Jun. 21, 2022 in connection with the Japanese Patent Application No. 2018-095173.
Office Action dated May 6, 2022, for corresponding Taiwanese Patent Application No. 107117012, along with an English translation.
Office Action dated May 17, 2022, for corresponding Taiwanese Patent Application No. 107117015, along with an English translation.
Sabah K. Bux et al., "Mechanochemical synthesis and thermoelectric properties of high quality magnesium silicide", Journal of Materials Chemistry, 2011, vol. 21, pp. 12259-12266, cited in NPL No. 1.
Aikebaier Yusufu et al., "Bottom-up nanostructured bulk silicon: a practical high-efficiency thermoelectric material", Nanoscale, 2014, vol. 6, pp. 13921-13927, cited in NPL No. 2.
Dario Narducci et al., "Silicon de novo: energy filtering and enhanced thermoelectric performances of nanocrystalline silicon and silicon alloys", Journal of Materials Chemistry C, 2015, vol. 3, pp. 12176-12185, cited in NPL No. 2.
Office Action dated Jan. 4, 2023 for corresponding Japanese Patent Application No. 2018-095172, along with an English translation (8 pages).
Office Action dated Jan. 4, 2023 for corresponding Japanese Patent Application No. 2018-095173, along with an English translation (11 pages).
Office Action dated Jan. 30, 2023 for corresponding Korean Patent Application No. 10-2019-7033739, along with an English translation (11 pages).

\* cited by examiner

METHOD OF PRODUCING SEMICONDUCTOR SINTERED BODY, ELECTRICAL/ELECTRONIC MEMBER, AND SEMICONDUCTOR SINTERED BODY

CROSS REFERENCE TO RELATED APPLICATION

This application claims the priority of Japanese Patent Application No. 2017-100107, filed on May 19, 2017, Japanese Patent Application No. 2017-100108, filed on May 19, 2017 and Japanese Patent Application No. 2017-199057, filed on Oct. 13, 2017 in the JPO (Japanese Patent Office). Further, this application is the National Phase Application of International Application No. PCT/JP2018/019160, filed on May 17, 2018, which designates the United States and was published in Japan. Both of the priority documents are hereby incorporated by reference in their entireties.

TECHNICAL FIELD

The present invention relates to a method of producing a semiconductor sintered body, an electrical/electronic member, and a semiconductor sintered body.

BACKGROUND ART

Among semiconductors, silicon provides advantages, such as ease of engineering control of electrical properties, availability at low cost, low toxicity, and environmental compatibility, and thus has been used in a variety of applications.

Silicon is a material with a relatively high thermal conductivity. Therefore, it is difficult to use a silicon-based material in a practical application in which a low thermal conductivity is required. However, nanostructuring by sintering nano-sized silicon particles, etc., which is a technique to reduce thermal conductivity, has been recently developed (Patent Literature 1 and Non Patent Literature 1).

CITATION LIST

Patent Literature

Patent Literature 1: U.S. Patent Application Publication No. 2014/0360546

Non Patent Literature

Non Patent Literature 1: Bux et al., Adv. Funct. Mater., 2009, 19, p. 2445-2452

SUMMARY OF INVENTION

Technical Problem

Although the nanostructuring as described in Patent Literature 1 and Non Patent Literature 1 may provide a silicon material with a reduced thermal conductivity, the electrical conductivity of the silicon material may also be decreased by the nanostructuring. Therefore, it has been difficult to use silicon materials in an application in which a high electrical conductivity and a low thermal conductivity are required at the same time.

In view of the above, it is an object of the present invention to provide a semiconductor material with an increased electrical conductivity while maintaining a reduced thermal conductivity.

Solution to Problem

One embodiment of the present invention provides a semiconductor sintered body comprising a polycrystalline body, wherein the polycrystalline body includes silicon, or a silicon alloy, an average particle size of crystal grains forming the polycrystalline body is 1 μm or less, and nanoparticles including one or more of a carbide of silicon, a nitride of silicon, and an oxide of silicon exist at a grain boundary of the crystal grains.

Advantageous Effects of Invention

According to one embodiment of the present invention, a semiconductor material with an increased electrical conductivity while maintaining a reduced thermal conductivity can be provided.

DESCRIPTION OF EMBODIMENTS

Embodiments according to the present invention will now be described in more detail. The present invention is not limited to the embodiments described in the specification, and combinations and improvements of the embodiments can be appropriately made without departing from the technical idea of the invention.

(Semiconductor Sintered Body)

An embodiment of the present invention is a semiconductor sintered body including a polycrystalline body, wherein the polycrystalline body includes silicon or a silicon alloy and an average grain size of crystal grains forming the polycrystalline body is 1 μm or less, and nanoparticles including one or more of a carbide of silicon, a nitride of silicon, and an oxide of silicon exist at a grain boundary of the crystal grains. The semiconductor sintered body according to an embodiment of the present invention is a polycrystalline body including silicon or a silicon alloy, wherein an average grain size of crystal grains forming the polycrystalline body is 1 μm or less, and nanoparticles including one or more of a carbide, a nitride, and an oxide of silicon exist at a grain boundary of the crystal grains.

In sintered bodies, there is a trade-off between a low thermal and a high electrical conductivity. Therefore, it has been difficult to lower the thermal conductivity and increase the electrical conductivity at the same time by the conventional approach. In contrast, the above-described constitution of the present embodiment may provide a semiconductor material having an increased electrical conductivity while maintaining a low thermal conductivity.

(Composition of Polycrystalline Body)

A semiconductor sintered body according to an embodiment of the present invention is a polycrystalline body including silicon. Specifically, the semiconductor sintered body may be a silicon-based polycrystalline body or silicon alloy-based polycrystalline body, that is, a polycrystalline body including silicon or a silicon alloy as a main crystal. The main crystal means a crystal with a highest precipitation proportion in the XRD pattern or the like, and preferably is a crystal that accounts for 55% by mass or more of the total polycrystalline body.

When the semiconductor sintered body is a polycrystalline body including a silicon alloy, the polycrystalline body may be a solid solution, a eutectic body, or an intermetallic compound of silicon and an element other than silicon. The element other than silicon included in the silicon alloy is not particularly limited as long as the element does not interfere with the effect of the present embodiment that the electrical conductivity can be increased while maintaining the low thermal conductivity of the sintered body, and may include Ge, Fe, Cr, Ta, Nb, Cu, Mn, Mo, W, Ni, Ti, Zr, Hf, Co, Ir, Pt, Ru, Mg, Ba, C, Sn, and the like. Such element may be included alone or in combination of two or more in the silicon alloy. Further, the silicon alloy preferably includes 2 to 20% by mass of one or two or more of the above-mentioned elements other than silicon. The silicon alloy may preferably be a silicon-germanium alloy, a silicon-tin alloy, or a silicon-lead alloy. Among such alloys, the silicon-germanium alloy is more preferred in light of the reduction of the thermal conductivity.

The semiconductor sintered body is a polycrystalline body having a so-called nanostructure, in which the average grain size of the crystal grains forming the polycrystalline body is 1 µm or less. Further, the average grain size of the crystal grains is preferably less than 1 µm, more preferably 800 nm or less, more preferably 500 nm or less, even more preferably 300 nm or less, and even more preferably 150 nm or less. Within the above range of the grain size of the crystal grains, the size of the crystal grains can be smaller than an average free path of phonons in the polycrystalline body, and thus the thermal conductivity can be reduced by phonon scattering at the interface.

Further, the lower limit of the average grain size of the crystal grains is not particularly limited, but may be not less than 1 nm in light of restriction in the manufacture.

In the specification, the average grain size of the crystal grains (and also the average size of the nanoparticles described later) means a median value of a longest diameter of individual crystal grains forming the crystalline body, directly measured in an observation by a microscope such as a scanning electron microscope (SEM) or a transmission electron microscope (TEM).

(Nanoparticles)

In the present embodiment, nanoparticles including one or more of a carbide of silicon, a nitride of silicon, and an oxide of silicon exist at a grain boundary of crystal grains of the polycrystalline body. The difference between the structure of the semiconductor polycrystalline body according to the present embodiment and the structure of the conventional semiconductor sintered body will now be described based on a silicon sintered body as an example.

Figure 1A:
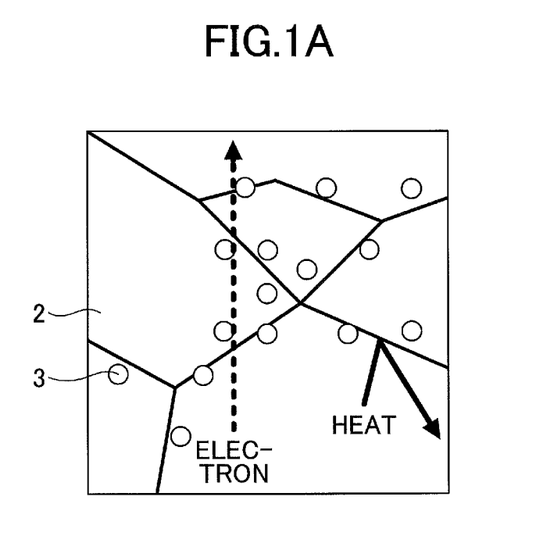
FIG. 1A is a schematic diagram showing a structure of a semiconductor sintered body according to an embodiment of the present invention.
Figure 1B:
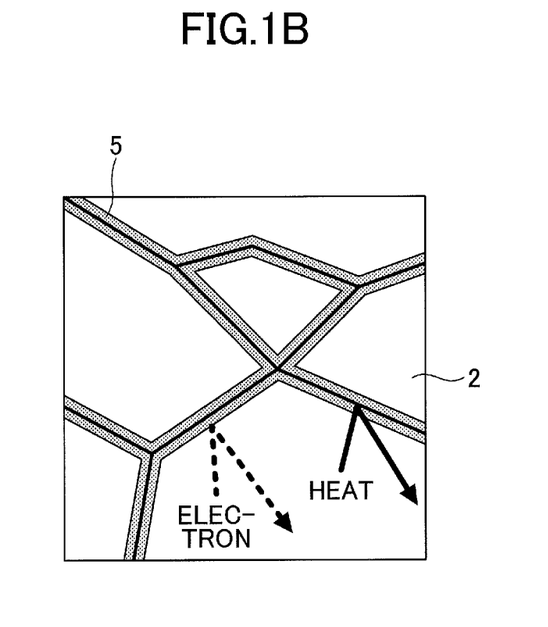
FIG. 1B is a schematic diagram showing a structure of a semiconductor sintered body according to the prior art.
Figure 2:
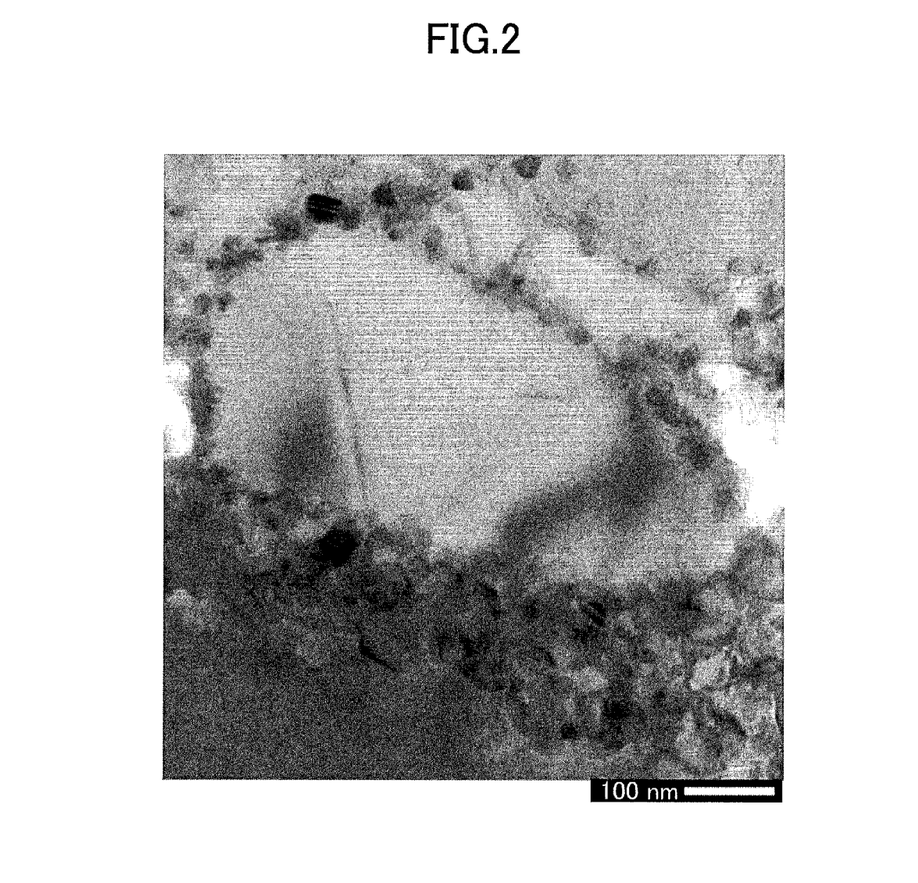
FIG. 2 is a transmission electron microscope (TEM) photograph of a semiconductor sintered body according to an embodiment of the present invention.

FIG. 1A schematically shows the structure of a silicon sintered body according to the present embodiment, and FIG. 1B schematically shows the structure of a conventional silicon sintered body. As shown in FIG. 1B, in a conventional silicon sintered body, a film 5 of an oxide of silicon (such as silicon dioxide) is formed along the interface (grain boundary) between the crystal grains 2, by oxidation of silicon during the sintering process. In the conventional silicon sintered body, the passage of electrons is obstructed by the film 5 of the oxide of silicon at the grain boundary, and thus electricity cannot be easily conducted through the sintered body.

On the other hand, in the silicon sintered body according to the present embodiment as shown in FIG. 1A, the silicon oxide film 5 is not formed along the grain boundary, but nanoparticles 3 exist. The nanoparticle 3 is generated by sintering after coating silicon particles (powder) with an aromatic compound as described below. In the sintering process, the aromatic compounds on the surface of the silicon particles are oxidized, and oxygen at the grain boundary is consumed. Therefore, no silicon oxides or only a marginal amount of silicon oxides may exist along the grain boundary in the sintered bodies according to the embodiment. Accordingly, the passage of electrons is not interfered with a silicon oxide film at the grain boundary resulting in a good conduction of the electricity. On the other hand, the nanoparticles 3 do not affect phonon scattering at the interface, and thus the low conductivity of heat as in the conventional sintered body shown in FIG. 1B is maintained. This may result in a sintered material having a high electrical conductivity while maintaining a low thermal conductivity can be obtained.

The nanoparticles present at the grain boundary may be one or more of silicon carbide, silicon nitride, silicon carbonitride, or silicon oxide. Further, the proportion of the nanoparticles present at the interface out of the total nanoparticles contained in the semiconductor sintered body may be preferably 90% or greater, and more preferably 95% or greater.

The nanoparticles existing at a grain boundary is meant to a nanoparticle the whole of which is present at the grain boundary, when focusing on one nanoparticle. The above also includes a nanoparticle a part of which is present at the grain boundary, and also a nanoparticle the whole of which is present near the grain boundary.

The average particle size of the nanoparticles is preferably in the range of 5 to 50 nm, and more preferably of 10 to 30 nm. The above range of the size of the nanoparticles allows phonons whose wavelength corresponds to the nanoparticle size to be effectively scattered. The phonons with such wavelength that cannot be scattered in a crystal lattice or raw material particles can be scattered, and thus the thermal conductivity can be significantly reduced.

(Application to Electrical and Electronic Materials)

As described above, according to the present embodiment, a semiconductor sintered body can be provided, which has an increased electrical conductivity while maintaining a low thermal conductivity. The semiconductor sintered body can be applied in electrical and electronic materials used in an environment that requires an increased electrical conductivity while maintaining a low conductivity or heat.

Since silicon is less toxic and available in lower cost than materials such as $Bi_2Te_3$ and PbTe, the semiconductor sintered body according to the present embodiment can provide environment-friendly electrical and electronic materials at low cost.

Further, the semiconductor sintered body according to the present embodiment may have a further increased electrical conductivity by incorporating dopants, etc., to be used as thermoelectric materials (thermoelectric conversion materials) in thermoelectric power generators.

To evaluate the thermoelectric performance (also referred to as thermoelectric conversion performance) of the thermoelectric material, a dimensionless thermoelectric performance index ZT [–] is generally used. The ZT is determined by the following equation.

$$ZT = \alpha^2 \sigma T / K \quad (1)$$

In the equation (1), α [V/K] represents a Seebeck coefficient, σ [S/m] represents an electric conductivity ("S" stands for Siemens and "m" stands for meter in the unit "S/m"), K [W/(mK)] represents a thermal conductivity, and T represents an absolute temperature [K]. The Seebeck coefficient α means an electrical potential difference generated per unit temperature difference. The larger the thermoelectric performance index ZT, the better the thermoelectric conversion performance. As is obvious from the equation (1), to improve the thermoelectric conversion performance ZT, a larger Seebeck coefficient α and a higher electrical conductivity σ, and a lower thermal conductivity K are desirable.

Silicon is known to have a high Seebeck coefficient α. Accordingly, by further increasing the electrical conductivity σ by including the dopants as described above, a higher value of the thermoelectric performance index ZT in the equation (1) can be obtained.

When the semiconductor sintered body of the present embodiment is used as a thermoelectric material, the semiconductor sintered body may comprise an n-type dopant or a p-type dopant depending on usage. Preferably, the dopants are uniformly dispersed in the entire sintered body. The n-type dopant may preferably include phosphorus, arsenic, antimony, and bismuth, and these can be included in the semiconductor sintered body alone or in combination of two or more. The p-type dopant may preferably include boron, aluminum, gallium, indium, and thallium, and these can be included in the semiconductor sintered body alone or in combination of two or more. The conductivity types of the above-described dopant elements are merely examples. Whether the dopant element functions as an n-type dopant or p-type dopant depends on the type of the element forming the parent crystal, the structure of the crystal, etc. in the resulting sintered body.

When the semiconductor sintered body includes a dopant, the dopant concentration in the sintered body is preferably 0.1 to 10, and more preferably 0.5 to 5 in terms of [$10^{20}$ atoms/cm$^3$] in the case of the n-type dopant. In the case of the p-type dopant, the dopant concentration in the sintered body is preferably 0.1 to 10, and more preferably 0.5 to 5 in terms of [$10^{20}$ atoms/cm$^3$]. The increased dopant concentration enables to enhance the electrical conductivity, and thus improve the thermoelectric performance ZT. However, when the dopant concentration is excessively high, the Seebeck coefficient may be decreased and the thermal conductivity may be increased, and thus the thermoelectric performance ZT may be decreased. However, the above range of the dopant concentration can improve the thermoelectric performance ZT.

The n-type dopant is preferably included at a concentration such that the Seebeck coefficient of the semiconductor sintered body is maintained in the range of –185 to –60 μV/K. The p-type dopant is preferably included at a concentration such that the Seebeck coefficient of the semiconductor sintered body is maintained in the range of 60 to 185 μV/K.

The electrical conductivity of the doped semiconductor sintered body is preferably 10,000 S/m or higher, more preferably 50,000 S/m or higher, more preferably 100,000 S/m or higher, and even more preferably 110,000 S/m or higher. The electrical conductivity can be a value at 27° C. The sintered body has an enhanced electrical conductivity as above, and thus the thermoelectric performance of the sintered body can be improved. In addition, the upper limit of the electrical conductivity of the semiconductor sintered body may be 600,000 S/m or lower, and 400,000 S/m or lower. The thermoelectric performance ZT of the semiconductor sintered body can be 0.2 or higher, preferably 0.3 or higher, and more preferably 0.4 or higher.

The thermal conductivity of the semiconductor sintered body according to the present embodiment is preferably 25 W/m·K or lower, and more preferably 10 W/m·K or lower. The above thermal conductivity may be a value at 27° C. Further, the absolute value of the Seebeck coefficient of the semiconductor sintered body is preferably 50 to 150 μV/K, and more preferably 80 to 120 μV/K. The above absolute value may be a value at 27° C.

When the semiconductor sintered body includes a dopant, the electrical conductivity can be further increased as described above, resulting in an improvement in the thermoelectric performance. Accordingly, the semiconductor sintered body according to the present embodiment can be suitably used in a power generation device utilizing waste heat, such as a power generation device mounted on a power generator and an exhaust system, such as an automobile or a ship, or a power generation device mounted on a heat radiation system of a heating furnace used for industrial purposes, and the like.

(Method of Manufacturing Semiconductor Sintered Body)

A method of manufacturing a semiconductor sintered body according to the present embodiment comprises steps of: preparing particles including silicon or a silicon alloy and having an average particle size of no greater than 1 μm; forming a coating of an organic compound including a dopant element, on a surface of the particles; and sintering the particles with the coating formed on the surface to obtain a semiconductor sintered body.

In the step of preparing particles including silicon or a silicon alloy having an average particle size of 1 μm or less, for example, particles (powder) having an average particle size of 1 μm or less may be prepared by melting a material of silicon or a silicon alloy that is to be a main crystal followed by cooling to a solid state, and pulverizing the resulting solid by a known method. The particles (powder) may also be synthesized from a raw material of silicon or a silicon alloy by a known crystal growth method such as chemical vapor deposition (CVD).

The average particle size obtained in the step of preparing particles is preferably less than 1 μm, more preferably 800 nm or less, more preferably 500 nm ore less, and even more preferably 300 nm or less. Further, the D90 size of the particles may be 1 μm or less, preferably 500 nm or less, and more preferably 200 nm or less. The above-described range of the particle size of the particles before sintering may result in a sintered body that includes crystal grains having a grain size of 1 μm or less and is appropriately densified. The lower limit of the average particle size to be prepared in the step of preparing particles is not limited, but the average particle size may preferably be 10 nm or greater in light of restriction in the manufacture. In the specification, the average particle size of the particles can be defined as a median diameter on a volumetric basis measured by a laser diffraction particle size distribution measuring device.

Subsequently, the step of forming a coating including an aromatic compound on the surface of the particles obtained in the step of preparing particles is performed. For example, the step of forming a coating can be performed by dispersing the particles obtained in the step of preparing particles in a solvent, adding an aromatic compound, and mixing by a bead mill or the like. Thereafter, the solvent is removed by decompression or the like, followed by drying to obtain particles with a coating of the aromatic compound formed on the surface. The coating may have a thickness of 0.5 to 5 nm, and preferably be a monomolecular film of the aromatic compound.

Since the film of an aromatic compound on the surface of the particles obtained in the particle preparation step is formed, the aromatic compounds are oxidized in the subsequent sintering step, so that oxygen is consumed on the particle surface. This can prevent forming an oxide of silicon along the grain boundary by reaction of silicon with oxygen. In that case, the structure shown in FIG. 1A, in which the nanoparticles produced by the reaction of the aromatic compound with silicon are present at and near the grain boundary, can be obtained.

The aromatic compound used may be a monocyclic compound or a polycyclic compound. The aromatic compound may also include a hydrocarbon-based compound consisting of carbon and hydrogen, or a heterocyclic compound including a heteroatom such as oxygen, sulfur, nitrogen, or the like. As the aromatic compound, a compound having 1 to 6 aromatic rings including or not including a heteroatom selected from an oxygen atom, a sulfur atom, and a nitrogen atom may be used, and a compound having 2 to 4 aromatic rings may preferably be used. The aromatic ring is preferably a six-membered ring. Examples of the aromatic compounds include hydrocarbons such as toluene, xylene, mesitylene, naphthalene, methylnaphthalene, vinyl naphthalene, anthracene, phenanthrene, acenaphthylene, and the like. Examples of the aromatic compounds also include aromatic compounds including a nitrogen atom such as phenanthroline, quinoline, isoquinoline, pyridine, methylpyridine, and the like. These aromatic compounds can be used alone or in combination of two or more.

As described above, the forming of a film of the aromatic compound on the surface of the particles allows for producing nanoparticles including an oxide of silicon such as silicon dioxide at the grain boundary and/or near the grain boundary in the subsequent step of sintering. In the step of sintering, carbon contained in the aromatic compound may also react with silicon to form silicon carbide. Further, when the aromatic compound contains a heteroatom, the heteroatom may react with silicon, so that the resulting nanoparticles may include a compound containing a heteroatom and silicon.

In the step of forming a coating, the aromatic compound may be added in an amount of preferably 10 to 60 parts by mass, more preferably 30 to 50 parts by mass, with respect to 100 parts by mass of the particles prepared in the step of preparing particles.

The method for the step of sintering may not be limited as long as the above-described raw particles (powder) can be sintered, but may include spark plasma sintering (SPS), atmospheric sintering (two step sintering), pressure sintering (hot pressing), hot isometric pressing (HIP), microwave sintering, and the like. Among such methods, the spark plasma sintering is preferred, by which smaller crystal grains can be grown.

The sintering temperature in the step of sintering may be selected depending on the composition of the silicon or silicon alloy main crystal to be obtained, but is preferably 900° C. or higher, and more preferably 1000° C. or higher. Further, the sintering temperature is preferably 1400° C. or lower, and more preferably 1300° C. or lower. The above range of the temperature can promote a densification of the sintered body, and maintain the average grain size of the polycrystalline grain of 1 µm or less.

Further, a rate of temperature rise in the step of sintering is preferably 10 to 100° C./minute, and more preferably 20 to 60° C./minute. The range of the rate of temperature rise enables to facilitate a uniform sintering and to suppress an excessively rapid grain growth to maintain the average grain size of the polycrystalline grains of 1 µm or less. In addition, the above range of the rate of temperature rise also enables to promote the formation of the nanoparticles through the oxidization of the aromatic compound, and prevent the oxide of silicon to be formed along the grain boundary.

In the step of sintering, pressure is preferably applied. In that case, the pressure to be applied is preferably 10 to 120 MPa, and more preferably 30 to 100 MPa.

The producing method according to the present embodiment may include, after the step of forming a coating, a step of adding a dopant in which a dopant is added to the particles obtained by the coating formation. The step of adding a dopant may be a step of applying or incorporating a dopant into the film formed. By adding a dopant in this step, the electrical conductivity of the semiconductor sintered body can be improved.

The step of adding a dopant can be performed, for example, by adding an organic compound containing a dopant element to the particles having the coating containing the aromatic compound formed on the surface, and mixing. Depending on the application, the dopant may contain n-type or p-type dopant elements. The n-type dopant element may be one or two or more elements selected from phosphorus, arsenic, antimony, and bismuth. The p-type dopant element may be one or two or more elements selected from boron, aluminum, gallium, indium, and thallium.

The organic compound including the dopant element may be a high-molecular weight compound or a low-molecular weight compound. The organic compound may be a hydride, an oxide, an oxo acid, or the like.

When phosphorus is used as an n-type dopant element, the organic compound may be phosphoric acid, an alkylphosphonic acid, an alkylphosphinic acid, and esters thereof, a polyvinylphosphonic acid, phosphine, a trialkylphosphine such as triethylphosphine or tributylphosphine, or the like. When arsenic is used as the dopant element, arsine or the like may be used. In the case of antimony, antimony trioxide or the like may be used. In the case of bismuth, bismuth acid or the like may be used.

When boron is used as the p-type dopant element, a borane cluster such as decaborane or ortho-decaborane, boron trifluoride, or the like may be used as the organic compound. Further, when aluminum is used as the dopant element, aluminum trichloride, trimethylaluminum, or the like may be used. In the case of gallium, gallium trichloride, trimethylgallium, or the like may be used. In the case of indium, indium trichloride or the like may be used. In the case of thallium, thallium chloride or the like may be used. The above-mentioned organic compound may be used alone or in combination of two or more.

The amount of the organic compound including the dopant element to be added is preferably 10 to 50 parts by mass, and more preferably 20 to 40 parts by mass with respect to 100 parts by mass of the coated particles.

Further, the step of adding a dopant can be included in the step of forming a coating. That is, after the particles obtained in the step of preparing particles are dispersed in a solvent, both the aromatic compound and the organic compound containing the dopant element are mixed by a bead mill or the like.

When the step of adding a dopant is performed as described, the dopant element is present on the coating or in the coating formed on the surface of the particle. Therefore, when such particles are sintered, the dopant elements are thermo-diffused from the interface between the particles to the interior of the particles. Such doping by the thermodiffusion from the particle interface can improve the resulting electrical conductivity of the sintered body. Further, the semiconductor sintered body obtained by the method according to the present embodiment may also exhibit a higher electrical conductivity, compared to a sintered body having an equivalent dopant concentration but having been doped without utilizing thermodiffusion from the particle interface.

In the method producing a semiconductor sintered body according to the present embodiment, dopants may preliminarily be incorporated in the particles in the step of preparing particles. For example, at a stage of melting a silicon material or a silicon alloy material that is to be a main crystal, an elemental substance of the dopant element or a compound thereof may be added and mixed, and then the obtained particles (powder) may be cooled and ground, to prepare particles (powder) containing a dopant. Further, when particles are prepared using a chemical vapor deposition (CVD) or the like, raw material of silicon or a silicon alloy and an elemental substance of a dopant element or compound thereof may be mixed in a gas phase, and then condensed to prepare particles containing a dopant. In this manner, a higher doping concentration is achieved by incorporating dopants in the step of preparing particles, and then thermodiffusing the dopants from the particle surface into the inside of the particles in the step of forming a coating and the step of sintering.

The present embodiment is a semiconductor sintered body produced by providing particles including silicon or a silicon alloy having an average particle size of less than 1 μm; forming a coating of an aromatic compound on a surface of the particles; and sintering the particles with the coating formed on the surface, to obtain a semiconductor sintered body. Such a semiconductor sintered body has a high electrical conductivity while maintaining a low thermal conductivity, and thus can be used in a variety of applications, such as electrical and electronic members used in an environment in which an enhanced electrical conductivity is required while maintaining a low conductivity of heat.

EXAMPLES

[N-Type Sintered Body]

Example 1

(Preparation of Silicon Particles)

28 g of elemental silicon (purity: 99.99% or greater) and 1.0 g of elemental phosphorus (purity: 99.9%) were melted under an argon atmosphere in an arc melting apparatus, followed by cooling. The mass obtained by cooling was tumbled, and again melted and cooled. The cycle of the melting and the cooling was repeated four times in total to obtain a dopant-containing silicon material as a base material. The silicon material was then crushed to a size of 45 μm or less using a hammer crusher and a planetary ball mill. Further, a bead mill was used to pulverize to have a D90 size of approximately 150 nm. In the pulverizing, isopropyl alcohol was used as medium, and zirconia beads with a diameter of 0.05 mm were used as the beads. Isopropyl alcohol was removed from the resulting slurry under reduced pressure followed by drying to provide silicon particles.

(Coating of Particles)

The resulting silicon particles were dispersed in heptane, and then phenanthrene was added in an amount of 2.0 g with respect to 25 g of silicon particles to obtain a mixture. The mixture was loaded in the above described bead mill, and a mixing process was performed for 300 minutes. The heptane and excess phenanthrene were then removed under reduced pressure, and dried to provide silicon particles coated with a monomolecular film.

(Sintering)

The silicon powder coated with the monomolecular film were loaded in a punch-die jig made of graphite, and heated to 1200° C. using a spark plasma sintering apparatus to obtain a sintered body. The applied pressure was 80 MPa, and the rate of temperature rise was 50° C./minute. The outer surface of the obtained sintered body was roughly polished to remove the impurity layer originated from the graphite or the like. The sintered body was further cut by using a dicing saw to obtain a rectangular parallelepiped chip.

(Structure and Properties)

The density of the sintered body measured by Archimedes method was 98.5% with respect to the density of pure silicon. Further, a cross-section of the sintered body was observed under a transmission electron microscope (TEM), and a structure was observed in which silicon grains with an average grain size of 100 nm were tightly bonded. Further, particle-like dispersed substances of silicon carbide are also observed near the grain boundary of the silicon, and the particle size of the dispersed substances was approximately 20 nm.

The sintered body had an electrical conductivity of $1.0 \times 10^5$ S/m at 27° C., and a thermal conductivity was 11.0 W/m·K. The dopant concentration was calculated based on the Seebeck coefficient (−95.7 μV/K) of the sintered body, and was 2.0 in terms of [$10^{20}$ atoms/cm$^3$]. The thermoelectric performance index ZT at 527° C. was 0.30.

Example 2

(Preparation of Silicon Particles)

Silicon particles were prepared in the same manner as in Example 1.

(Coating of Particles)

Silicon particles coated with a monomolecular film were obtained in the same manner as Example 1, except that the mixture contained 2.0 g of anthracene instead of 2.0 g of phenanthrene.

(Sintering)

Similar to Example 1, a silicon powder coated with a monomolecular film was sintered to obtain a sintered body, and a rectangular parallelepiped chip was obtained.

(Structure and Properties of Sintered Body)

The density of the sintered body measured by Archimedes method was 98.5% with respect to the density of pure silicon. A cross-section of the sintered body was observed under a transmission electron microscope (TEM), and a structure was observed in which silicon particle with an average grain size of 100 nm were tightly bonded. Further, particle-like dispersed substances of silicon carbide are also observed near the grain boundary of the silicon, and the particle size of the dispersed substances was approximately 20 nm.

The sintered body had an electrical conductivity of $1.0 \times 10^5$ S/m at 27° C., and a thermal conductivity was 10.5

W/m·K. The dopant concentration was calculated based on the Seebeck coefficient (−93.5 μV/K) of the sintered body, and was 2.1 in terms of $[10^{20}$ atoms/cm$^3]$. The thermoelectric performance index ZT at 527° C. was 0.36.

Example 3

(Preparation of Silicon Particles)

The raw materials, 100 molar equivalents of monosilane (SiH$_4$, purity: 99.9%) and 3 molar equivalents of phosphine (PH$_3$, purity 99.9%) were reacted in a microwave plasma reactor under flowing of an argon/hydrogen mixture gas to synthesize nanoparticles, which were collected by an in-line filter. The silicon nanoparticles were obtained as aggregates with an average particle size of approximately 150 nm, and an average size of the crystallites was 10 nm.

(Coating of Particles)

Silicon particles coated with a monomolecular film were obtained in the same manner as Example 1, except that the mixture contained 1.5 g of isoquinoline instead of phenanthrene 2.0 g.

(Sintering)

Similar to Example 1, a silicon powder coated with a monomolecular film was sintered to obtain a sintered body, and a rectangular parallelepiped chip was obtained.

(Structure and Properties of Sintered Body)

The density of the sintered body measured by Archimedes method was 98% with respect to the density of pure silicon. A cross-section of the sintered body was observed under a transmission electron microscope (TEM), and a structure was observed in which silicon particle with an average grain size of 100 nm were tightly bonded. Further, particle-like dispersed substances of silicon carbide are also observed near the grain boundary of the silicon, and the particle size of the dispersed substances was approximately 20 nm.

The sintered body had an electrical conductivity of 1.0× 10$^5$ S/m at 27° C., and a thermal conductivity was 9.5 W/m·K. The dopant concentration was calculated based on the Seebeck coefficient (−95.8 μV/K) of the sintered body, and was 2.0 in terms of $[10^{20}$ atoms/cm$^3]$. The thermoelectric performance index ZT at 527° C. was 0.30.

Example 4

(Preparation of Silicon Particles)

Silicon particles were prepared in the same manner as in Example 2.

(Coating of Particles)

Similar to Example 2, silicon particles coated with a monomolecular film were obtained.

(Sintering)

In the same manner as Example 2, a sintered body was obtained, except that tributylphosphine was added in an amount of 1.0 g with respect to 5.0 g of the resulting silicon particles coated with the monomolecular film, and a rectangular parallelepiped chip was obtained.

(Structure and Properties of Sintered Body)

The density of the sintered body measured by Archimedes method was 98% with respect to the density of pure silicon. A cross-section of the sintered body was observed under a transmission electron microscope (TEM), and a structure was observed in which silicon particle with an average grain size of 100 nm were tightly bonded. Further, particle-like dispersed substances of silicon carbide are also observed near the grain boundary of the silicon, and the particle size of the dispersed substances was approximately 20 nm.

The sintered body had an electrical conductivity of 1.2× 10$^5$ S/m at 27° C., and a thermal conductivity was 9.5 W/m·K. The dopant concentration was calculated based on the Seebeck coefficient (−97.9 μV/K) of the sintered body, and was 1.9 in terms of $[10^{20}$ atoms/cm$^3]$. The thermoelectric performance index ZT at 527° C. was 0.36.

Example 5

(Preparation of Silicon Particles)

Silicon particles were prepared in the same manner as in Example 3.

(Coating of Particles)

In the same manner as in Example 3, silicon particles coated with a monomolecular film were obtained.

(Sintering)

A sintered body was obtained in the same manner as in Example 3, except that tributylphosphine was added in an amount of 1.0 g with respect to 5.0 g of the obtained silicon powder coated with a monomolecular film, followed by sintering, and a rectangular parallelepiped chip was obtained.

(Structure and Properties of Sintered Body)

The density of the sintered body measured by Archimedes method was 98% with respect to the density of pure silicon. A cross-section of the sintered body was observed under a transmission electron microscope (TEM), and a structure was observed in which silicon particle with an average grain size of 100 nm were tightly bonded. Further, particle-like dispersed substances of silicon carbide are also observed near the grain boundary of the silicon, and the particle size of the dispersed substances was approximately 20 nm.

The sintered body had an electrical conductivity of 1.1× 10$^5$ S/m at 27° C., and a thermal conductivity was 9.5 W/m·K. The dopant concentration was calculated based on the Seebeck coefficient (−91.4 μV/K) of the sintered body, and was 2.3 in terms of $[10^{20}$ atoms/cm$^3]$. The thermoelectric performance index ZT at 527° C. was 0.30.

Example 6

(Preparation of Silicon Alloy Particles)

Particles were prepared in the same manner as in Example 1, except that 28 g of elemental silicon (purity: 99.99% or higher) and 3.0 g of elemental germanium (purity: 99.99% or higher) were used instead of 28 g of elemental silicon (purity: 99.99% or higher), and silicon alloy particles were obtained.

(Coating of Particles)

The same treatment as in Example 1 was performed to obtain silicon alloy particles coated with a monomolecular film.

(Sintering)

The silicon alloy particles coated with the monomolecular film were sintered to obtain a sintered body in the same manner as in Example 1, and a rectangular parallelepiped chip was obtained.

(Structure and Characteristics of Crystal)

The density of the sintered body measured by Archimedes method was 98.5% with respect to the density of the silicon alloy before being ground. A cross-section of the sintered body was observed under a transmission electron microscope (TEM), and a structure was observed in which silicon alloy particle with an average grain size of 100 nm were tightly bonded. Further, particle-like dispersed substances of silicon carbide are also observed near the grain boundary of the silicon alloy, and the particle size of the dispersed substances was approximately 20 nm.

The sintered body had an electrical conductivity of 1.0× $10^5$ S/m at 27° C., and a thermal conductivity was 11.0 W/m·K. The dopant concentration was calculated based on the Seebeck coefficient (−83.0 μV/K) of the sintered body, and was 3.0 in terms of [$10^{20}$ atoms/cm³]. The thermoelectric performance index ZT at 527° C. was 0.40.

Example 7

(Preparation of Silicon Alloy Particles)

Silicon alloy particles were obtained in the same manner as in Example 6.

(Coating of Particles)

A treatment was performed to obtain silicon alloy particles coated with a monomolecular film in the same manner as in Example 1, except that the mixture contained 2.0 g of anthracene instead of 2.0 g of phenanthrene.

(Sintering)

A treatment was performed in the same manner as in Example 1, except that tributylphosphine was added in an amount of 1.0 g with respect to 5.0 g of the monomolecular film-coated silicon particles to obtain a sintered body, and a rectangular parallelepiped chip was obtained.

(Structure and Properties of Sintered Body)

The density of the sintered body measured by Archimedes method was 98% with respect to the density of the silicon alloy before being ground. A cross-section of the sintered body was observed under a transmission electron microscope (TEM), and a structure was observed in which silicon particle with an average grain size of 100 nm were tightly bonded. Further, particle-like dispersed substances of silicon carbide are also observed near the grain boundary of the silicon, and the particle size of the dispersed substances was approximately 20 nm.

The sintered body had an electrical conductivity of 1.2× $10^5$ S/m at 27° C., and a thermal conductivity was 6.2 W/m·K. The dopant concentration was calculated based on the Seebeck coefficient (−82.0 μV/K) of the sintered body, and was 3.1 in terms of [$10^{20}$ atoms/cm³]. The thermoelectric performance index ZT at 527° C. was 0.45.

Example 8

(Preparation of Silicon Alloy Particles)

Silicon alloy particles were prepared in the same manner as in Example 3, except that 95% by mole of monosilane ($SiH_4$, purity: 99.9%) and 5% by mole of tetraethylgermanium ($GeEt_4$, purity: 99.9%) were used instead of 100% by mole of monosilane ($SiH_4$, purity: 99.9%). Silicon alloy particles were obtained as aggregates with an average particle size of approximately 150 nm, and the average length of the crystallites was 10 nm.

(Coating of Particles)

In the same manner as in Example 3, silicon alloy particles coated with a monomolecular film were obtained.

(Sintering)

A sintered body was obtained in the same manner as in Example 3, except that tributylphosphine was added in an amount of 1.0 g with respect to 5.0 g of the resulting monomolecular film-coated silicon particles, and then sintered, and a rectangular parallelepiped chip was obtained.

(Structure and Properties of Sintered Body)

The density of the sintered body measured by Archimedes method was 98% with respect to the density of the silicon alloy before being ground. A cross-section of the sintered body was observed under a transmission electron microscope (TEM), and a structure was observed in which silicon particle with an average grain size of 100 nm were tightly bonded. Further, particle-like dispersed substances of silicon carbide and silicon nitride are also observed near the grain boundary of the silicon, and the particle size of the dispersed substances was approximately 20 nm.

The sintered body had an electrical conductivity of 1.1× $10^5$ S/m at 27° C., and a thermal conductivity was 5.5 W/m·K. The dopant concentration was calculated based on the Seebeck coefficient (−82.7 μV/K) of the sintered body, and was 3.0 in terms of [$10^{20}$ atoms/cm³]. The thermoelectric performance index ZT at 527° C. was 0.40.

[P-Type Sintered Body]

Example 9

(Preparation of Silicon Particles)

28 g of elemental silicon (purity: 99.99% or greater) and 0.5 g of monomeric boron (purity: 99.9%) were melted under an argon atmosphere in an arc melting apparatus, followed by cooling. The mass obtained by cooling was tumbled and again melted and cooled. The cycle of melting and cooling was repeated four times in total to obtain a dopant-containing silicon material as a base material. The silicon material was then crushed to a size of 45 μm or less using a hammer crusher and a planetary ball mill. Further, a bead mill was used to pulverize to have a D90 size of approximately 150 nm. In the pulverizing, isopropyl alcohol was used as the medium, and zirconia beads with a diameter of 0.05 mm were used as the beads. Isopropyl alcohol was removed from the resulting slurry under reduced pressure followed by drying to provide silicon particles.

(Coating of Particles)

The resulting silicon particles were dispersed in heptane, and phenanthrene was added in an amount of 2.0 g with respect to 25 g of silicon particles to obtain a mixture. The mixture was loaded in the above-mentioned bead mill, and a mixing process was performed for 300 minutes. The heptane and excessive phenanthrene were then removed under reduced pressure followed by drying to provide silicon particles coated with a monomolecular film.

(Sintering)

The silicon powder coated with the monomolecular film was loaded in a punch-die jig made of graphite and heated to 1200° C. using a spark plasma sintering apparatus to obtain a sintered solid. The applied pressure was 80 MPa, and the rate of temperature rise was 50° C./minute. The surface of the sintered body was roughly polished to remove the impurity layer originated from the graphite or the like. The sintered body was further cut by a dicing saw to obtain a rectangular parallelepiped chip. The density of the sintered body measured by Archimedes method was 98.5% with respect to the density of pure silicon.

(Structure and Properties of Sintered Body)

The density of the sintered body measured by Archimedes method was 98% with respect to the density of pure silicon. Further, a cross-section of the sintered body was observed under a transmission electron microscope (TEM), and a structure was observed in which silicon grains with an average grain size of 100 nm were tightly bonded. Further, particle-like dispersed substances of silicon carbide are also observed near the grain boundary of the silicon, and the particle size of the dispersed substances was approximately 20 nm.

The sintered body had an electrical conductivity of 1.0× $10^5$ S/m at 27° C., and a thermal conductivity was 11.0

W/m·K. The dopant concentration was calculated based on the Seebeck coefficient (95.7 μV/K) of the sintered body, and was 2.0 in terms of [$10^{20}$ atoms/cm$^3$]. The thermoelectric performance index ZT at 527° C. was 0.30.

Example 10

(Preparation of Silicon Particles)

Silicon particles were prepared in the same manner as in Example 9.

(Coating of Particles)

Silicon particles coated with monomolecular film were obtained in the same manner as in Example 9, except that the mixture contained 2.0 g of anthracene instead of 2.0 g of phenanthrene.

(Sintering)

A sintered body was obtained in the same manner as in Example 9, except that the silicon powder coated with the monomolecular film was sintered to obtain a sintered body, and a rectangular parallelepiped chip was obtained.

(Structure and Properties of Sintered Body)

The density of the sintered body measured by Archimedes method was 98% with respect to the density of pure silicon. Further, a cross-section of the sintered body was observed under a transmission electron microscope (TEM), and a structure was observed in which silicon grains with an average grain size of 100 nm were tightly bonded. Further, particle-like dispersed substances of silicon carbide are also observed near the grain boundary of the silicon, and the particle size of the dispersed substances was approximately 20 nm.

The sintered body had an electrical conductivity of 1.0× $10^5$ S/m at 27° C., and a thermal conductivity was 10.3 W/m·K. The dopant concentration was calculated based on the Seebeck coefficient (92.6 μV/K) of the sintered body, and was 2.1 in terms of [$10^{20}$ atoms/cm$^3$]. The thermoelectric performance index ZT at 527° C. was 0.30.

Example 11

(Preparation of Silicon Particles)

The raw materials, 100 molar equivalents of monosilane (SiH$_4$, purity: 99.9%) and 3 molar equivalents of diborane (B$_2$H$_4$, purity: 99.9%) were reacted in a microwave plasma reactor under flowing of an argon/hydrogen mixture gas to synthesize nanoparticles, which were collected by an in-line filter. The silicon nanoparticles were obtained as aggregates with an average particle size of approximately 150 nm, and the average size of the crystallite was 10 nm.

(Coating of Particles)

The resulting silicon particles were treated in the same manner as in Example 9, except that the mixture contained 1.5 g of isoquinoline instead of 2.0 g of phenanthrene to obtain silicon particles coated with a monomolecular film.

(Sintering)

In the same manner as in Example 9, silicon particles coated with a monomolecular film were sintered to obtain a sintered body, and a rectangular parallelepiped chip was obtained.

(Structure and Properties of Sintered Body)

The density of the sintered body measured by Archimedes method was 98% with respect to the density of pure silicon. A cross-section of the sintered body was observed under a transmission electron microscope (TEM), and a structure was observed in which silicon particle with an average grain size of 100 nm were tightly bonded. Further, particle-like dispersed substances of silicon carbide and silicon nitride are also observed near the grain boundary of the silicon, and the particle size of the dispersed substances was approximately 20 nm.

The sintered body had an electrical conductivity of 1.0× $10^5$ S/m at 27° C., and a thermal conductivity was 9.6 W/m·K. The dopant concentration was calculated based on the Seebeck coefficient (94.7 μV/K) of the sintered body, and was 2.0 in terms of [$10^{20}$ atoms/cm$^3$]. The thermoelectric performance index ZT at 527° C. was 0.30.

Example 12

(Preparation of Silicon Particles)

Silicon particles were prepared in the same manner as in Example 9.

(Coating of Particles)

In the same manner as in Example 9, the mixture contained 2.0 g of anthracene instead of 2.0 g of phenanthrene was loaded in the above bead mill, and a mixing treatment was performed for 300 minutes. Thereafter, heptane and excess anthracene were removed under reduced pressure, followed by drying to obtain monomolecular film-coated silicon particles.

(Sintering)

A treatment was performed in the same manner as in Example 9 except that tributylborane was added in an amount of 1.6 g with respect to 5.0 g of the resulting monomolecular film-coated silicon particles, followed by sintering to obtain a sintered body, and a rectangular parallelepiped chip was obtained.

(Structure and Characteristics of the Crystal)

The density of the sintered body measured by Archimedes method was 98% with respect to the density of pure silicon. A cross-section of the sintered body was observed under a transmission electron microscope (TEM), and a structure was observed in which silicon particle with an average grain size of 100 nm were tightly bonded. Further, particle-like dispersed substances of silicon carbide and silicon nitride are also observed near the grain boundary of the silicon, and the particle size of the dispersed substances was approximately 20 nm.

The sintered body had an electrical conductivity of 1.2× $10^5$ S/m at 27° C., and a thermal conductivity was 11.3 W/m·K. The dopant concentration was calculated based on the Seebeck coefficient (95.4 μV/K) of the sintered body, and was 2.0 in terms of [$10^{20}$ atoms/cm$^3$]. The thermoelectric performance index ZT at 527° C. was 0.36.

Example 13

(Preparation of Silicon Particles)

Silicon particles were prepared in the same manner as in Example 11.

(Coating of Particles)

In the same manner as in Example 13, silicon particles coated with a monomolecular film were obtained.

(Sintering)

A treatment was performed in the same manner as in Example 11, except that tributylborane was added in an amount of 1.6 g with respect to 5.0 g of the resulting monomolecular film-coated silicon particles, followed by sintering to obtain a sintered body, and a rectangular parallelepiped chip was obtained.

(Structure and Properties of Sintered Body)

The density of the sintered body measured by Archimedes method was 98% with respect to the density of pure silicon. A cross-section of the sintered body was observed under a transmission electron microscope (TEM), and a structure was observed in which silicon particle with an average grain size of 100 nm were tightly bonded. Further, particle-like dispersed substances of silicon carbide and silicon nitride are also observed near the grain boundary of the silicon, and the particle size of the dispersed substances was approximately 20 nm.

The sintered body had an electrical conductivity of $1.1 \times 10^5$ S/m at 27° C., and a thermal conductivity was 9.6 W/m·K. The dopant concentration was calculated based on the Seebeck coefficient (90.3 μV/K) of the sintered body, and was 2.2 in terms of [$10^{20}$ atoms/cm$^3$]. The thermoelectric performance index ZT at 527° C. was 0.35.

Example 14

(Preparation of Silicon Alloy Particles)

The same treatment as Example 9 was performed to obtain silicon alloy particles, except that 28 g of elemental silicon (purity: 99.99% or higher) and 3.0 g of elemental germanium (purity: 99.99% or higher) were used instead of 28 g of elemental silicon (purity: 99.99% or higher).

(Coating of Particles)

The same treatment as Example 9 was performed to obtain silicon alloy particles coated with a monomolecular film.

(Sintering)

In the same manner as in Example 9, the silicon alloy particles coated with the monomolecular film were sintered to obtain a sintered body, and a rectangular parallelepiped chip was obtained.

(Structure and Properties of Sintered Body)

The density of the sintered body measured by Archimedes method was 98.5% with respect to the density of the silicon alloy before being ground. A cross-section of the sintered body was observed under a transmission electron microscope (TEM), and a structure was observed in which silicon alloy particle with an average grain size of 100 nm were tightly bonded. Further, particle-like dispersed substances of silicon carbide are also observed near the grain boundary of the silicon alloy, and the particle size of the dispersed substances was approximately 20 nm.

The sintered body had an electrical conductivity of $1.0 \times 10^5$ S/m at 27° C., and a thermal conductivity was 5.5 W/m·K. The dopant concentration was calculated based on the Seebeck coefficient (84.6 μV/K) of the sintered body, and was 3.0 in terms of [$10^{20}$ atoms/cm$^3$]. The thermoelectric performance index ZT at 527° C. was 0.40.

Example 15

(Preparation of Silicon Alloy Particles)

In the same manner as in Example 14, silicon alloy particles were obtained.

(Coating of Particles)

The same treatment as in Example 9 was performed to obtain silicon alloy particles coated with a monomolecular film, except that the mixture contained 2.0 g of anthracene instead of 2.0 g of phenanthrene.

(Sintering)

The same treatment as that of Example 9 was performed, except that tributylborane was added in an amount of 1.6 g with respect to 5.0 g of the resulting monomolecular film-coated silicon particles, followed by sintering to obtain a sintered body, and a rectangular parallelepiped chip was obtained.

(Structure and Properties of Sintered Body)

The density of the sintered body measured by Archimedes method was 98% with respect to the density of the silicon alloy before being ground. A cross-section of the sintered body was observed under a transmission electron microscope (TEM), and a structure was observed in which silicon alloy particle with an average grain size of 100 nm were tightly bonded. Further, particle-like dispersed substances of silicon carbide are also observed near the grain boundary of the silicon alloy, and the particle size of the dispersed substances was approximately 20 nm.

The sintered body had an electrical conductivity of $1.2 \times 10^5$ S/m at 27° C., and a thermal conductivity was 6.2 W/m·K. The dopant concentration was calculated based on the Seebeck coefficient (80.9 μV/K) of the sintered body, and was 3.3 in terms of [$10^{20}$ atoms/cm$^3$]. The thermoelectric performance index ZT at 527° C. was 0.36.

Example 16

(Preparation of Silicon Alloy Particles)

Silicon alloy particles were prepared in the same manner as in Example 11, except that 95% by mole of monosilane (SiH$_4$, purity: 99.9%) and 5% by mole of tetraethylgermanium (GeEt$_4$, purity: 99.9%) were used instead of 100% by mole of monosilane (SiH$_4$, purity: 99.9%). Silicon alloy particles were obtained as aggregates with an average particle size of approximately 150 nm, and the average length of the crystallites was 10 nm.

(Coating of Particles)

In the same manner as in Example 11, silicon alloy particles coated with a monomolecular film were obtained.

(Sintering)

The same treatment was performed as in Example 11, except that tributylborane was added in an amount of 1.6 g with respect to 5.0 g of the resulting monomolecular film-coated silicon particles, followed by sintering to obtain a sintered body, and a rectangular parallelepiped chip was obtained.

(Structure and Properties of Sintered Body)

The density of the sintered body measured by Archimedes method was 98% with respect to the density of the silicon alloy before being ground. A cross-section of the sintered body was observed under a transmission electron microscope (TEM), and a structure was observed in which silicon particle with an average grain size of 100 nm were tightly bonded. Further, particle-like dispersed substances of silicon carbide and silicon nitride are also observed near the grain boundary of the silicon, and the particle size of the dispersed substances was approximately 20 nm.

The sintered body had an electrical conductivity of $1.1 \times 10^5$ S/m at 27° C., and a thermal conductivity was 5.7 W/m·K. The dopant concentration was calculated based on the Seebeck coefficient (84.2 μV/K) of the sintered body, and was 3.0 in terms of [$10^{20}$ atoms/cm$^3$]. The thermoelectric performance index ZT at 527° C. was 0.40.

The present application is based on and claims priority to Japanese Patent Application No. 2017-100107 filed on May 19, 2017; Japanese Patent Application No. 2017-100108 filed on May 19, 2017; and Japanese Patent Application No. 2017-199057 filed on Oct. 13, 2017, the entire contents of which are hereby incorporated by reference.

DESCRIPTION OF SYMBOLS

2 Grain
3 Nanoparticle
5 Silicon oxide film

The invention claimed is:

1. A method of producing a semiconductor sintered body comprising:
    a step of preparing particles comprising silicon or a silicon alloy and having an average particle size of less than 1 μm;
    a step of forming a coating comprising an aromatic compound on a surface of the particles by dispersing the particles in a liquid solvent, adding a solid aromatic compound, mixing, and removing the liquid solvent by decompression, leaving the aromatic compound on the particle; and
    a step of sintering the particles with the coating formed on the surface of the particles to obtain a semiconductor sintered body,
    wherein the semiconductor sintered body includes a polycrystalline body including nanoparticles that include one or more of a carbide of silicon, a nitride of silicon, and an oxide of silicon exist at a grain boundary of crystal grains.

2. The method of producing a semiconductor sintered body according to claim 1, wherein the aromatic compound has 1 to 6 aromatic rings, with or without a heteroatom selected from an oxygen atom, a sulfur atom, and a nitrogen atom.

3. The method of producing a semiconductor sintered body according to claim 1, further comprising a step of adding one or more dopants selected from phosphorus, arsenic, antimony, and bismuth.

4. The method of producing a semiconductor sintered body according to claim 1, comprising a step of adding one or more dopants selected from boron, aluminum, gallium, indium, and thallium.

5. The method of producing a semiconductor sintered body according to claim 1, wherein the step of sintering is performed at 900° C. or higher.

6. The method of producing a semiconductor sintered body according to claim 1, wherein the step of sintering comprises spark plasma sintering.

7. The method of producing a semiconductor sintered body according to claim 1, wherein the coating has a thickness of 0.5 to 5 nm.

8. The method of producing a semiconductor sintered body according to claim 1, wherein an amount of the aromatic compound in the step of forming the coating is 10 to 60 parts by mass with respect to 100 parts by mass of the particles prepared in the step of preparing particles.

9. The method of producing a semiconductor sintered body according to claim 1, wherein the aromatic compound is at least one compound selected from the group consisting of toluene, mesitylene, naphthalene, methylnaphthalene, vinyl naphthalene, anthracene, phenanthrene, acenaphthylen, phenanthroline, quinoline, isoquinoline, pyridine, and methylpyridine.

10. The method of producing a semiconductor sintered body according to claim 1, wherein the aromatic compound is at least one selected from the group consisting of naphthalene, methylnaphthalene, vinyl naphthalene, anthracene, phenanthrene, acenaphthylene, phenanthroline, and isoquinoline.

11. A method of producing a semiconductor sintered body comprising:
    a step of preparing particles comprising silicon or a silicon alloy and having an average particle size of less than 1 μm;
    a step of forming a coating comprising an aromatic compound on a surface of the particles by dispersing the particles in a liquid solvent, adding a solid aromatic compound, mixing, and removing the liquid solvent by decompression, leaving the aromatic compound on the particle; and
    a step of sintering the particles with the coating formed on the surface of the particles to obtain a semiconductor sintered body.

12. The method of producing a semiconductor sintered body according to claim 11, wherein the aromatic compound has 1 to 6 aromatic rings, with or without a heteroatom selected from an oxygen atom, a sulfur atom, and a nitrogen atom.

13. The method of producing a semiconductor sintered body according to claim 11, further comprising a step of adding one or more dopants selected from phosphorus, arsenic, antimony, and bismuth.

14. The method of producing a semiconductor sintered body according to claim 11, comprising a step of adding one or more dopants selected from boron, aluminum, gallium, indium, and thallium.

15. The method of producing a semiconductor sintered body according to claim 1, wherein the step of sintering is performed at 900° C. or higher.

16. The method of producing a semiconductor sintered body according to claim 11, wherein the step of sintering comprises spark plasma sintering.

17. The method of producing a semiconductor sintered body according to claim 11, wherein the coating has a thickness of 0.5 to 5 nm.

18. The method of producing a semiconductor sintered body according to claim 11, wherein an amount of the aromatic compound in the step of forming the coating is 10 to 60 parts by mass with respect to 100 parts by mass of the particles prepared in the step of preparing particles.

19. The method of producing a semiconductor sintered body according to claim 11, wherein the aromatic compound is at least one compound selected from the group consisting of toluene, mesitylene, naphthalene, methylnaphthalene, vinyl naphthalene, anthracene, phenanthrene, acenaphthylen, phenanthroline, quinoline, isoquinoline, pyridine, and methylpyridine.

20. The method of producing a semiconductor sintered body according to claim 11, wherein the aromatic compound is at least one selected from the group consisting of naphthalene, methylnaphthalene, vinyl naphthalene, anthracene, phenanthrene, acenaphthylene, phenanthroline, and isoquinoline.

* * * * *